United States Patent [19]
Bickley

[11] Patent Number: 5,152,005
[45] Date of Patent: Sep. 29, 1992

[54] HIGH RESOLUTION FREQUENCY SYNTHESIS

[75] Inventor: Robert H. Bickley, Scottsdale, Ariz.

[73] Assignee: Motorola, Inc., Schaumburg, Ill.

[21] Appl. No.: 774,173

[22] Filed: Oct. 15, 1991

Related U.S. Application Data

[63] Continuation of Ser. No. 468,440, Jan. 22, 1990, abandoned.

[51] Int. Cl.[5] .................. H04B 1/40; H04B 17/02; H03L 7/00
[52] U.S. Cl. .................... 455/76; 455/165.1; 455/182.1; 455/183.1; 455/192.1; 455/260; 331/2; 331/25
[58] Field of Search .................. 455/75–76, 455/165, 182, 183, 192, 260; 328/14; 307/529; 331/2, 25

[56] References Cited

U.S. PATENT DOCUMENTS

| | | | |
|---|---|---|---|
| 4,542,531 | 9/1985 | Fukumura | 455/76 |
| 4,593,411 | 6/1986 | Schiller | 455/183 |
| 4,791,387 | 12/1988 | Hasegawa et al. | 331/2 |
| 4,940,950 | 7/1990 | Helfrick | 455/260 |
| 4,963,838 | 10/1990 | Hapeyama | 455/260 |

OTHER PUBLICATIONS

IEEE, vol. CE-24, No. 1, Feb. 1978 "A New Design Technique for Digital PLL Synthesizers", BREEZE,E.

Primary Examiner—Reinhard J. Eisenzopf
Assistant Examiner—Andrew Faile
Attorney, Agent, or Firm—Robert M. Handy; Maurice J. Jones

[57] ABSTRACT

The synthesizer includes an output PLL having a divide-by-N1 divider in its feedback loop. The output PLL is couples through frequency offset circuitry to receive a reference signal from a driver PLL having a divide-by-N2 divider in its feedback loop. Another divide-by-N1 divider coupled a reference oscillator to the driver PLL. The reference oscillator provides another reference signal. As a result, the setting for N1 controls the course frequency tuning and the setting for N2 controls the fine frequency tuning of the synthesizer which provides any one of a plurality of selectable predetermined output frequencies. The adjacent selectable frequencies are closer together than the frequencies of the reference signals. The synthesizer has a simple configuration and provides a high degree of output frequency resolution, fast acquisition and low noise.

37 Claims, 3 Drawing Sheets

HIGH RESOLUTION FREQUENCY SYNTHESIS

This application is a continuation of application Ser. No. 468,440, filed Jan. 22, 1990, now abandoned.

BACKGROUND OF THE INVENTION

This invention relates in general to radio frequency (RF) synthesizers and particularly to RF synthesizers which have high frequency resolutions and which minimize the deleterious effects of noise.

Modern high frequency communication systems such as transceivers or equipment for testing such systems often include frequency converters having synthesizer circuits which perform a variety of functions. For instance, such synthesizers when operated in a "receive" mode provide a local oscillator output signal having a selected one of any of a plurality of predetermined stable reference frequencies. The local oscillator signal can be applied to a mixer to convert the frequencies of a modulated signal. When operated in a "transmit" mode or as a signal generator, the synthesizer provides a selected one of a plurality stable reference frequencies which can be modulated and then either transmitted by an antenna or directly applied to a receiver being tested, for instance.

Some prior art synthesizers each commonly has a phase locked loop (PLL) which includes a phase detector having an output coupled through a loop filter to control the frequency of a voltage controlled oscillator (VCO). The output of the VCO is fed back to one input of the phase detector through a divide-by-N circuit. A constant reference frequency is applied to another input of the phase detector by a crystal oscillator, for instance. The frequency of the VCO output signal is changed in steps by changing the divisor "N" of the divide-by-N circuit in a known manner. This prior art synthesizer is capable of providing N different discrete frequencies which are each separated from the nearest discrete frequency by the frequency of the reference oscillator. Each discrete output frequency is equal to N times the reference frequency.

In many applications, it is desirable for "N" to be kept to a minimum so that the reference frequency can have a high magnitude for a given output frequency. For example, the loop filter is required to attenuate the reference frequency so that it doesn't modulate the VCO. Thus, a high reference frequency enables the loop filter to have a wide bandwidth thereby facilitating rapid change between synthesizer output frequencies responsive to "N" being changed. Additionally, the high reference frequency simplifies the loop filter design. Furthermore, since "N" is a multiplier of the noise generated by the active components within the PLL, it is advantageous from a low noise standpoint for "N" to be minimized. Hence, many advantages result from reducing the magnitude of "N".

The "frequency resolution" of the above-described phase locked loop however is related to the number of separate discrete frequencies provided over a given output bandwidth. Unfortunately, as "N" decreases, the amount of resolution decreases because the number of possible output frequencies is equal to the number of possible values of "N". Changing the value of "N" in the aforementioned low "N" prior art PLL provides a coarse tuning control of the output frequency thereof. For many applications, it is desirable to enable "fine tuning" of the frequency of the PLL output signal to more thoroughly cover a frequency band by providing output signals having smaller predetermined incremental steps therebetween, for instance. Having a high reference frequency complicates meeting this "fine tuning" requirement. More particularly, merely increasing "N" and reducing the reference frequency would decrease the allowable bandwidth of the loop filter thereby increasing acquisition time, complicating the loop filter design and increasing the noise multiplication. Increased noise adversely affects the stability of the synthesizer output frequency.

Some prior art frequency synthesizers having low noise, fast lock and high resolution are too expensive, unreliable, range limited and/or complex for many applications. Also, many such prior art synthesizers require too much electrical power for battery operated equipment. More specifically, prior art solutions for fulfilling the foregoing requirements sometimes use direct frequency synthesizers which have separate mixers, dividers and filters for each decade of output frequency. These circuits are complex and expensive. Other prior art techniques employ indirect frequency synthesizers with multiple loops and RF offset mixing. Additionally, direct digital synthesis, which is employed by numerically controlled oscillators, provide undesirably high spurious and minimum noise floors as well as low operating frequencies. Also, the performance of such direct digital systems is often limited by high speed, digital-to-analog converter circuitry included therein. Moreover, numerically controlled oscillators consume increasing amounts of electrical power as the operating frequency is increased. Still other prior art techniques utilize differential loop synthesis with reference frequencies differing by the desired frequency step size. These frequencies are then mixed to provide the RF offset frequency. Differential loop synthesizers suffer from a limited range of frequency coverage Also, the above and other prior art techniques sometimes require expensive discrete components for operation at high RF frequencies and careful shielding to minimize spurious

SUMMARY OF THE INVENTION

Accordingly, it is an object of the present invention to provide simple and inexpensive phase locked loop, frequency synthesizer circuitry for creating a selected one of any of a plurality of chosen discrete frequencies within a predetermined band while enabling the reference frequency to be maintained at relatively high values and still provide a large number of output frequencies as compared to prior art synthesizers.

One embodiment of the invention relates to receiving or sending circuitry each including a frequency synthesizer that provides an output signal having a selected one of a plurality of discrete frequencies. The synthesizer includes a first PLL providing the synthesizer output signal. The first PLL has a phase detector with an output coupled through a loop filter to a VCO. A feedback circuit, including a first variable divider, is connected between the output of the VCO and an input of the phase detector. The first divider divides the frequency of signals applied thereto by a divisor, N1. The synthesizer also includes a second PLL having a divide-by-N2 divider in the feedback circuit thereof. The second phase locked loop provides a control signal having a selectable frequency. A second variable divider for dividing the frequency of signals applied thereto by the divisor N1, applies a first reference signal to the second PLL. The second PLL is coupled to the phase detector of the first PLL through a frequency offset circuit which is responsive to the control signal to provide a second reference signal having a selected frequency to the first phase locked loop. Modulation circuitry can be connected to the frequency offset circuit. The second reference signal has different frequencies corresponding to different values of N1 and N2. The different frequencies of the second reference signal enable the first PLL to provide the synthesizer output signal having the selected one of a plurality of discrete frequencies. The foregoing synthesizer enables the reference frequencies to be at high magnitudes while providing a large number of output frequencies that are spaced closer together than the reference frequencies of the first and second PLL's.

BRIEF DESCRIPTION OF THE DRAWINGS

A more complete understanding of the present invention may be derived by referring to the detailed description and claims when considered along with the accompanying drawings in which like reference numbers indicate similar parts and wherein:

DETAILED DESCRIPTION OF THE PREFERRED EMBODIMENT

Figure 1:
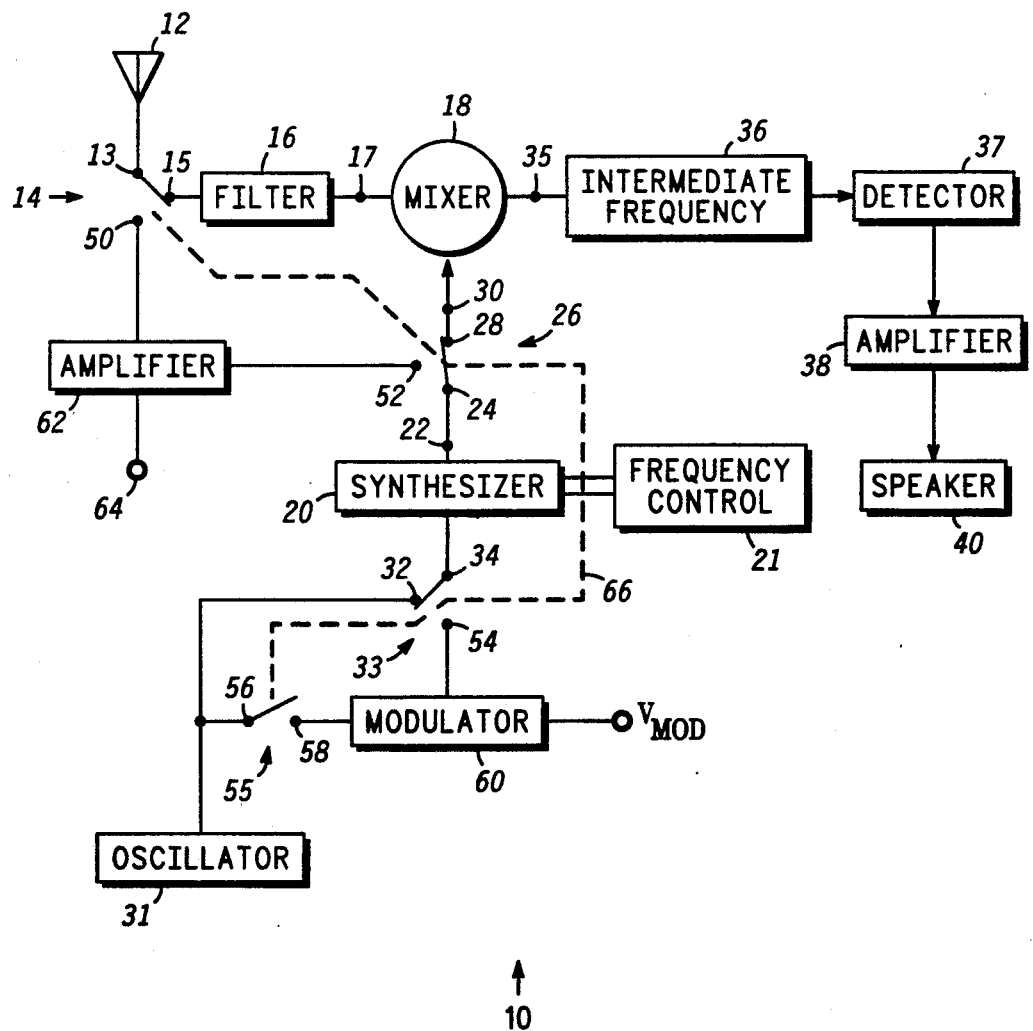
FIG. 1 is a block diagram of a transceiver or a portion of a piece of test equipment employing a frequency synthesizer.

Referring now to the drawings, FIG. 1 shows a block diagram of transceiver or test equipment 10 having "receive" and "transmit" modes of operation. In the receive mode, an antenna 12 or other signal input means provides an input signal to terminal 13 of a switch 14 which makes contact between terminals 13 and 15 thereof. Hence, the input signal is applied through bandpass filter 16 to an input terminal 17 of a mixer 18.

A synthesizer 20 includes an output terminal 22 connected to terminal 24 of a switch 26. In the receive mode, switch 26 connects terminal 24 to terminal 28 thereof. The frequency of the output signal of synthesizer 20 is controlled in response to digital codes or programs provided by frequency control circuit 21 which is connected to synthesizer 20. Terminal 28 of switch 26 is connected to another input terminal 30 of mixer 18. The output of reference oscillator 31 is connected to terminal 32 of switch 33. In the receive mode, switch 33 interconnects terminals 32 and 34 thereof so that synthesizer 20 receives the output of oscillator 31. Thus, a selected one of the plurality of fixed discrete frequencies generated by synthesizer 20 is applied to mixer 18.

Mixer 18 responds to the input signal on terminal 17 and to the synthesized signal on input terminal 30 to provide an intermediate frequency (IF) signal at output terminal 35 which is coupled to IF amplifier 36. Detector 37 is connected to the output of IF amplifier 34 and receives the amplified IF signal therefrom. Detector 36 provides a demodulated output signal. Amplifier 38 is connected to receive the output signal of detector 37.

The demodulated signal level is increased by amplifier 38 and the resulting signal is applied to a utilization means such as speaker 40.

Alternatively, in the "transmit mode" of operation, switch 14 is operated to connect antenna 12 to terminal 50, switch 26 is operated to connect terminal 24 to terminal 52, switch 33 is operated to connect terminal 34 to terminal 54 and switch 55 interconnects terminals 56 and 58 thereof. As a result, modulator 60 receives the output of oscillator 31 and applies a modulated signal to synthesizer 20. The modulated output of synthesizer 20 is amplified by amplifier 62 and either transmitted by antenna 12 or delivered for testing purposes to output terminal 64.

All switches such as 14, 26, 33 and 55 described herein, although shown as mechanical-type switches, can be implemented by semiconductor devices, for instance. Also, all of the foregoing switches can be operated simultaneously, as indicated by dashed line 66.

Figure 2:
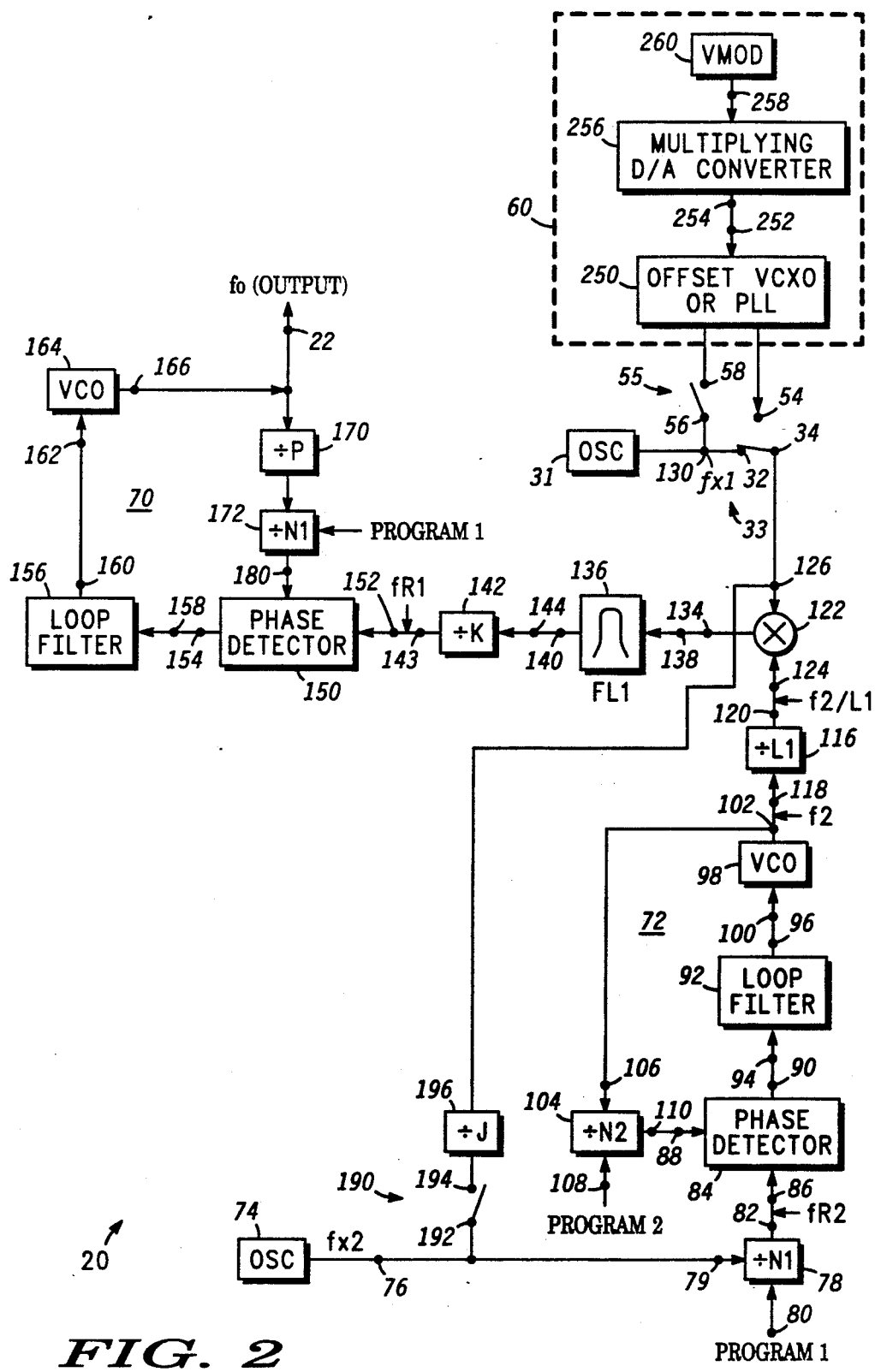
FIG. 2 is a block diagram of a frequency synthesizer for the circuitry of FIG. 1 which can provide a fixed frequency output signal having a frequency that is selectable by both coarse and fine tuning and which can be modulated.

As shown in FIG. 2, synthesizer 20 utilizes two PLL's 70 and 72. PLL 70 provides synthesizer output signals in response to the output of loop 72 which is divided by fixed dividers 116 and 142 respectively having divisors "Ll" and "K" to provide fine frequency resolution. As previously described, synthesizer 20 operates in either a modulated transmit mode or an unmodulated receive mode depending on the positions of a plurality of switches including switches 33 and 55 of FIG. 2. The unmodulated mode will first be described as follows:

Fine tuning phase locked loop 72 responds to a reference oscillator 74, which may be a crystal oscillator, that provides a stable frequency $f \times 2$ at output terminal 76 thereof. Programmable divide by "N1" circuit 78 includes an input terminal 79 connected to output terminal 76, a control terminal 80, and an output terminal 82. Programmable divider 78 responds to binary control signals (PROGRAM 1), for instance, applied to terminal 80 by frequency control circuit 21 of FIG. 1 to adjust the value of "N1" in a known manner. Phase detector 84 includes a first input terminal 86 connected to the output terminal 82 of divider 78. Detector 84 also has a second input terminal 88 and an output terminal 90. Loop filter 92 includes an input terminal 94 and an output terminal 96. Input terminal 94 is connected to terminal 90 to receive the output of phase detector 84. VCO 98 includes a control terminal 100, which is connected to terminal 96 to receive the output of loop filter 92, and an output terminal 102.

Programmable divide by "N2" 104 has an input terminal 106 connected to output 102 of VCO 98, a control terminal 108, and an output terminal 110 which is connected to the other input 88 of phase detector 84. Divider 104 responds to control signals (PROGRAM 2) applied to terminal 108 thereof by circuit 21 of FIG. 1 to adjust divisor N2. In operation, oscillator 74 provides fixed frequency signal "fx2" which is divided by divisor N1 to provide a reference signal "fR2" at terminal 86 of phase detector 84. Loop 72 responds to generate an output signal "f2" at terminals 102 in a known manner.

Fixed divider 116 has an input terminal 118 connected to receive output signal f2 from VCO 98. Divider 116 divides f2 by "Ll" to provide an output signal at output terminal 120 thereof equal to f2/Ll. Offset mixer 122 has a first input terminal 124 connected to divider output terminal 120 and another input terminal 126. Offset oscillator 31 has an output terminal 130 which is connected by switch 33 through terminals 32 and 34 thereof to input terminal 126 of mixer 122. Oscillator 31 provides an offset reference output signal at terminal 130 having a frequency fx1. Mixer 122 receives f2/L1 and fx1, which are respectively applied to terminals 120 and 122, and provides the sum and difference of the signals at output terminal 134 thereof. Bandpass filter 136 has an input terminal 138 connected to receive the output signals of mixer 122. Filter 136 selects the sum, for instance, of the signal components from mixer 122 to provide (fx1+f2/L1) at output terminal 140 thereof and has a center frequency of fL1.

Fixed divide by divisor "K" circuit 142 has an input terminal 144 connected to output terminal 140. Divide-by-K circuit 142 provides a reference signal for PLL 70, fR1 at output terminal 143 thereof. Phase detector 150 of PLL 70 has an input terminal 152 which is connected to receive fR1. Loop filter 156 has an input terminal 158 which is connected to output terminal 154 of phase detector 150. The control terminal 162 of VCO 164 is connected to the output terminal 160 of loop filter 156. Output terminal 166 of VCO 164 is connected to output terminal 22 of loop 70 to provide the synthesizer output signal "fo". A fixed prescaler or divide by "P" 170 and a programmable divide-by-"N1" 172 are connected in series between VCO output terminal 166 and input terminal 180 of phase detector 150. PROGRAM 1 from circuit 21 controls divider 172.

An equation showing the relationship between the magnitude of the divisors of the dividers and the oscillator frequencies of synthesizer 20 will next be derived. Ignoring prescaler 170, the frequency of the output signal, fo of PLL 70 is expressed by Equation 1.

$$fo = fR1 \times N1 \qquad \text{Equation (1)}$$

The reference frequency for loop 70, fR1 is provided by Equation 2 as follows:

$$fR1 = \left(fx1 + \frac{f2}{L1}\right)/K \qquad \text{Equation (2)}$$

The output frequency, f2 of PLL 72 is provided by Equation 3 as follows:

$$f2 = fR2 \times N2 \qquad \text{Equation (3)}$$

The reference frequency, fR2 for loop 72 is provided by Equation 4 as follows:

$$fR2 = fx2/N1 \qquad \text{Equation (4)}$$

Equation 1 for output frequency of is combined with Equation 2 for fR1, to provide Equation 5 as follows:

$$fo = \left(fx1 + \frac{f2}{L1}\right)\frac{N1}{K} \qquad \text{Equation (5)}$$

Equation 6 is provided by combining Equations 3 and 4:

$$f2 = fx2 \frac{N2}{N1} \qquad \text{Equation (6)}$$

Equation 7 is formed by combining Equations 5 and 6:

$$fo = \left|fx1 + \frac{fx2\left(\frac{N2}{N1}\right)}{L1}\right|\frac{N1}{K} = fx1\left(\frac{N1}{K}\right) + fx2\left(\frac{N2}{KL1}\right) \qquad \text{Equation (7)}$$

Note that the "N1's" associated with PLL's 70 and 72 cancel each other in the above mathematical operation of Equation 7. Equation 8 results from rewriting Equation 7 as follows:

$$fo = N1\left(\frac{fx1}{K}\right) + N2\left(\frac{fx2}{KL1}\right) \qquad \text{Equation (8)}$$

From Equation 8, it can be seen that the coarse tuning steps are provided controlling N1 according to the first expression of Equation 8 as follows:

$$N1\left(\frac{fx1}{K}\right) \qquad \text{Equation (9)}$$

and fine tuning steps are provided by the second expression of Equation 8 as follows:

$$N2\left(\frac{fx2}{KL1}\right) \qquad \text{Equation (10)}$$

The key to bringing about the results of Equations 9 and 10 is that the divisor N1 of divider 78 is equal to N1 of divider 172. Otherwise, a synthesizer output signal, fo with fractional or some other indeterminate frequency might result at synthesizer output terminal 22.

In the receive mode, it is possible to eliminate offset oscillator 31 by utilizing a signal derived from output signal, fx2 of oscillator 74. More specifically, switch 190 is shown in FIG. 2 with contacts 192 and 194 and divide-by-J divider 196 connected in series between reference oscillator output terminal 76 and offset mixer input terminal 126. With switch 190 closed, switch 33 open and J=2, then $$fx1 = \tfrac{1}{2}fx2.$$

If prescaler 170 of PLL 70 is included in the derivation for fo, where P is the divisor of prescaler 130, then:

$$fo = P\left[N1\left(\frac{fx1}{K}\right) + N2\left(\frac{fx2}{KL1}\right)\right] \qquad \text{Equation (11)}$$

A numerical example of the frequencies of synthesizer are shown in Table 1 as follows:

TABLE 1

| | |
|---|---|
| fx1 | 5.0 MHz |
| fx2 | 10.0 MHz |
| N1 | 116 to 166 |
| J | 2 |
| fR2 | 86.2 to 60.2 KHz |
| N2 | 4460 to 6820 |
| f2 | 400 MHz, ± 18.97 MHz when N1 = 116 |
| L1 | 800 |
| f2/L1 | 500 KHz Nominal |
| fL1 | 5.5 MHz Nominal Center Frequency |
| K1 | 10 |

TABLE 1-continued

| | |
|---|---|
| fR1 | 550 KHz Nominal |
| P | 4 |
| fo | 255-365 MHz. in 5 KHz Steps |

Table 2 shows the N1 and N2 values for synthesizer 20 characterized by the parameters of Table 1.

TABLE 2

N1 & N2 VALUES FOR FIG. 2

| fo (MHz) | N1 | fo-2N1 (MHz) | N2 = (fo-2N1)/ (.005) | f2 = 10N1/N2 (MHz) |
|---|---|---|---|---|
| 255 | 116 | 23 | 4600 | 396.5517241 |
| 256.3 | 116 | 24.3 | 4860 | 418.9655172 |
| 256.3 | 117 | 22.3 | 4460 | 381.1965812 |
| 364.1 | 165 | 34.1 | 6820 | 413.333333 |
| 364.1 | 166 | 32.1 | 6420 | 386.746988 |
| 365.0 | 166 | 33.0 | 6600 | 397.5903614 |

The offset of f2/L1 by f×1 by offset mixer 122 allows for a large value of division (KL1) which facilitates small, e.g. 5 KHz, steps between each frequency while still maintaining a high, eg. 550 KHz, reference frequency, fR1 for loop 1 and a high, eg. 60.2 KHz, reference frequency, fR2 for loop 2. The high fR1 has the advantage that N1 is minimized. Since N1 is the divisor for PLL 72 reference, the low value of N1 also maximizes fR2. The high values for fR1 and fR2 are desirable for fast lock, low noise and low spurious content of the signals at the outputs of VCO's 164 and 98. The frequency of fL1 of filter 136 can typically be in a range where small, inexpensive ceramic filters are available. The small output frequency steps provided by divider 104 (N2) are not modified by the multiplier (N1) in loop 1. The output frequency range and resolution is determined by N1 (coarse steps) and N2 (fine steps) along with frequency standards f×1 and f×2 which may be equal to each other.

Figure 3:
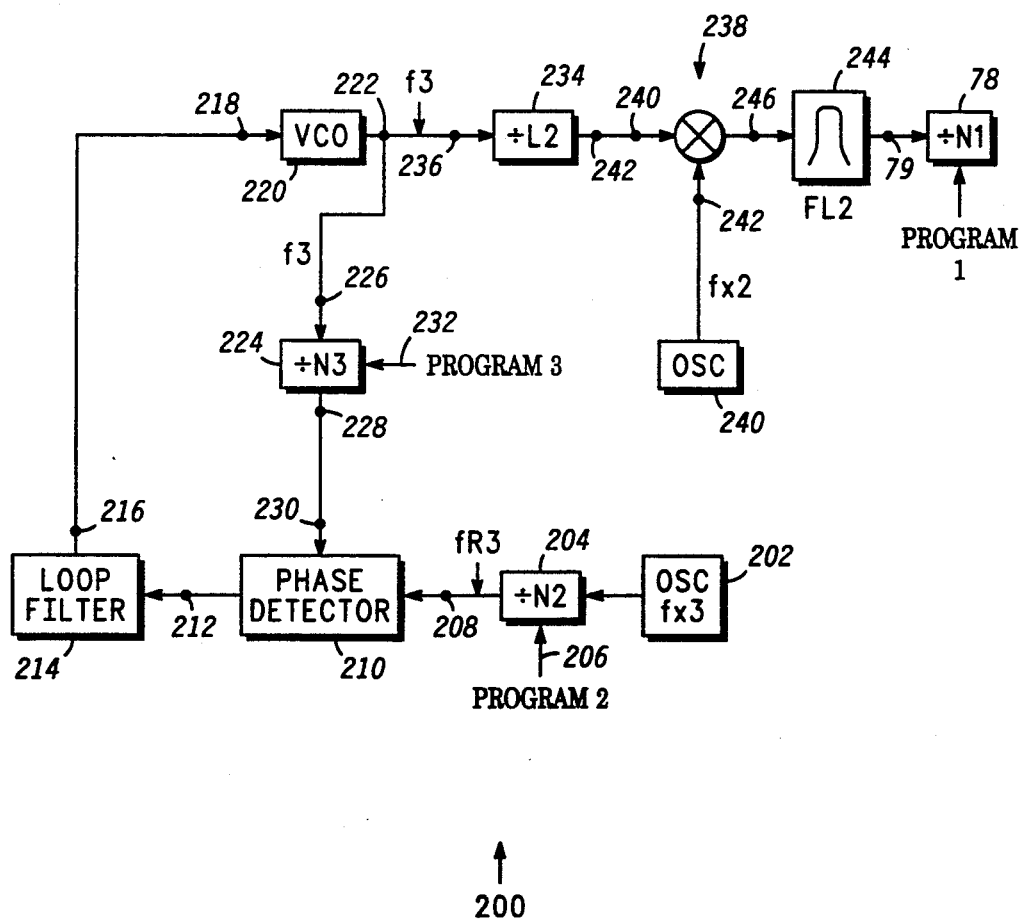
FIG. 3 a block diagram of additional circuitry which can be coupled to the synthesizer of FIG. 2 for providing additional resolution of the output frequency.

FIG. 3 shows a third loop 200 which can be added in place of oscillator 74 of FIG. 2 to provide additional fine frequency resolution. By utilizing loop 200, the ratio of the output frequency to step size can be made as large as $10^6$ while maintaining relatively high reference frequencies in all the loops. More specifically, loop 200 operates with an oscillator 202 having an output, f×3 applied to a variable divide-by-N2 divider 204. Terminal 206 of divider 204 is adapted to receive PROGRAM 2 which controls the N2 divider 104 of loop 72. As a result, divider 204 provides a reference frequency fR3 to one input 208 of phase detector 210. Input terminal 212 of loop filter 214 is connected to receive the output signal of phase detector 210. Output terminal 216 of loop filter 214 is connected to control terminal 218 of VCO 220. Output signal f3 is provided at output terminal 222 of VCO 22 thereof. Divide-by-N3 circuit 224 has an input 226 connected to the output of VCO 220 for receiving f3. The output terminal 228 of divider 224 is connected to another input terminal 230 of phase detector 210. Control terminal 232 of divider 224 is adapted to receive a PROGRAM 3 for controlling the divisor thereof.

Fixed divide-by-L2 circuit 234 has an input terminal 236 for receiving f3. Offset mixer 238 has an input terminal 240 connected to output terminal 242 of divider 234. Offset reference oscillator 240 provides a reference signal f×2 to another input terminal 242 of mixer 238. Offset mixer 238 performs a function similar to offset mixer 122 of FIG. 2. Filter 244 is connected between output 246 of mixer 238 and input terminal 79 of divider 78 of FIG. 2. The remainder of the circuitry can be as shown in FIG. 2.

The output frequency of PLL 70 including PLL 200 can be derived in a manner similar to that shown for the configuration in FIG. 2, to be represented by the following Equation:

$$fo = N1\left(\frac{fx1}{K}\right) + N2\left(\frac{fx2}{KL1}\right) + N3\left(\frac{fx3}{KL1L2}\right) \quad \text{Equation (12)}$$

The last term of Equation 12 shows the additional resolution provided by the addition of loop 200 of FIG. 3.

Referring now to FIG. 2, in the modulated or transmit mode, switch 55 is operated so that oscillator output terminal 130 is connected to terminal 58 to thereby apply the output of oscillator 31 to modulator PLL 250. Also, switch 33 is operated to make connection between terminals 34 and 54 thereof so that the output of PLL 250 is applied to terminal 126 of mixer 122. Input terminal 252 of modulator 250 is connected to the output terminal 254 of multiplying digital-to-analog converter 256. Input terminal 258 of converter 256 is connected to receive the modulating signal from modulating signal source 260. Converter 256 scales the modulating signal $V_{MOD}$ by K/N1. This provides a constant modulation index at all output frequencies of PLL 70.

What has been described is an economical, fast lock, fine resolution synthesizer 20 with as few as two loops and thus reduced parts count, lower power consumption, smaller size and improved reliability as compared to some prior art synthesizer having similar performance. Since reference frequency mixing is employed in synthesizer 20 as opposed to loop output frequency mixing, the mixers and filters of synthesizer 20 may be low cost and small. Moreover, spurious frequency generation with attendant filtering and isolation amplifier requirements is reduced. Additionally, the above described approach allows the use of relatively high loop reference frequencies, fR1, fR2 and fR3 and yet provides fine frequency steps with only a few loops. Because the noise and spurious responses of PLL 72 are substantially reduced by 20 log (N1/KL1) and because offset mixer 122 operates at a relatively low frequency, synthesizer 20 is particularly adaptable to being included in an integrated circuit. Fixed prescaler 170 in PLL 70 of FIG. 2 improves performance including the acquisition time by reducing N1 and thus increasing fR2. Prescaler 170 allows the use of a low power CMOS LSI circuitry for N1 dividers 78 and 172, K divider 142 and phase detector 150 along with a simple prescaler configuration 170 for PLL 70. Unlike some prior art approaches, a wide (greater than 2:1) output frequency range can covered by synthesizer 20.

While the invention has been particularly shown and described with reference to preferred embodiments, those skilled in the art will understand that changes in form and details may occur therein without departing from the scope of the present invention.

I claim:

1. A frequency synthesizer for providing an output signal having a selected one of any of a plurality of predetermined discrete frequencies Fo, including in combination:

first phase locked loop means for providing the synthesizer output signal of frequency Fo, said first phase locked loop means having an input frequency Fi and a feedback circuit comprising a first variable divider means for dividing the frequency of signals applied thereto by a divisor N1 so that Fo is proportional to N1×Fi;

second phase locked loop means for providing a control signal having a selectable frequency determined at least in part by a numerical factor N2 reference oscillator means for providing a first reference signal;

second variable divider means for dividing the frequency of signals applied thereto by a divisor M, said second divider means being coupled to said second phase locked loop means;

first circuit means coupling said reference oscillator means to said second divider means; and second circuit means coupling said second phase locked loop means to said first phase locked loop means, said second circuit means being responsive to said control signal to provide to said first phase locked loop said input frequency Fi having different values corresponding to different values of N2 and M according to N2/M where M=N1, said synthesizer output signal having the selected one of any of a plurality of predetermined discrete frequencies Fo depending on N2 and N1.

2. The frequency synthesizer of claim 1 wherein said second circuit means includes:

means for providing a first offset reference signal;

mixer means having first and second inputs and an output;

third circuit means coupling said first input of said mixer means to said second phase locked loop means;

fourth circuit means coupling said second input of said mixer means to said means for providing said first offset reference signal; and fifth circuit means coupling said output of said mixer means to said first phase locked loop means to provide said input frequency Fi to said first phase locked loop means.

3. The frequency synthesizer of claim 2 wherein said means for providing said first offset reference signal includes further oscillator means.

4. The frequency synthesizer of claim 3 wherein said means for providing said first offset reference signal further includes modulator means for modulating the frequency of said oscillator means.

5. The frequency synthesizer of claim 2 wherein said third circuit means includes fixed divider means.

6. The frequency synthesizer of claim 2 wherein said fifth circuit means includes a fixed divider coupled between said mixer means and said first phase locked loop means.

7. The frequency synthesizer of claim 2 wherein said fifth circuit means includes filter means connected in series with fixed divider means.

8. The frequency synthesizer of claim 1 wherein said feedback circuit of said first phase locked loop means further includes a prescaler.

9. The frequency synthesizer of claim 1 wherein said first circuit means includes in combination:

third phase locked loop means having an input and an output, said input of said third phase locked loop means being coupled to said reference oscillator means; and offset circuit means coupled between said output of said third phase locked loop means and said second variable divider means.

10. The frequency synthesizer of claim 9 wherein said offset circuit means includes:

means for providing an offset reference signal;

mixer means coupled to said means for providing an offset reference signal; and filter means coupled between said mixer means and said second phase locked loop means; and fixed divider means coupled between said third phase locked loop means and said mixer means.

11. The frequency synthesizer of claim 1 wherein:

said second phase locked loop means has a feedback circuit;

third variable divider means included in said feedback circuit of said second phase locked loop means, said third divider means dividing the frequency of signal applied thereto by a divisor equal to N2; and adjustment of N1 thereby providing coarse frequency steps in the frequency of the synthesizer output signal and adjustment of N2 providing fine frequency steps of the frequency synthesizer output signal.

12. A receiver having a mixer and a frequency synthesizer for providing an output signal to the mixer having a selected one of any of a plurality of predetermined discrete frequencies Fo, the synthesizer including in combination:

first phase locked loop means for providing the synthesizer output signal, said first phase locked loop means having an input frequency Fi and a first feedback circuit comprising first variable divider means for dividing the frequency of signals applied thereto by a first divisor N1 so that Fo is proportional to N1×Fi;

second phase locked loop means for providing a control signal having a selectable frequency, said second phase locked loop means having a second feedback circuit;

second variable divider means included in said second feedback circuit, said second divide means dividing the frequency of signals applied thereto by a second divisor N2;

reference oscillator means for providing a first reference signal;

third variable divider means for dividing the frequency of signals applied thereto by said first divisor N1, said third divider means coupling said reference oscillator means to said second phase locked loop means; and first circuit means coupling said second phase locked loop means to said first phase locked loop means, said first circuit means being responsive to said control signal to provide to said first phase locked loop said input frequency Fi having different predetermined values corresponding to different values of N1 and N2, said synthesizer output signal to the mixer having said selected one of any of said plurality of predetermined discrete frequencies.

13. The receiver of claim 12 further including divisor control means coupled to said first, second and third variable divider means.

14. The receiver of claim 12 wherein said first circuit means includes:

means for providing an offset reference signal;

mixer means having first and second inputs and an output;

second circuit means coupling said first input of said mixer means to said second phase locked loop means;

third circuit means coupling said second input of said mixer means to said means for providing said offset reference signal; and fourth circuit means coupling said output of said mixer means to said first phase locked loop means to provide said second reference signal to said first phase locked loop means.

15. The receiver of claim 14 wherein said means for providing said offset reference signal includes further oscillator means.

16. The receiver of claim 14 wherein said second circuit means includes fixed divider means.

17. The receiver of claim 14 wherein said third circuit means includes fixed divider means coupled between said reference oscillator means and said second input of said mixer means.

18. The receiver of claim 14 wherein said fourth circuit means includes filter means connected in series with a further fixed divider means.

19. The receiver of claim 14 further having fifth circuit means for coupling said third variable divider means to said second phase locked loop means, said fifth circuit means includes in combination:

third phase locked loop means having an input and an output, said input of said third phase locked loop means being coupled to said reference oscillator means; and offset circuit means coupled between said output of said third phase locked loop means and said third variable divider means.

20. A signal sending system having a frequency synthesizer for providing an output signal having a selected one of any of a plurality of predetermined discrete frequencies Fo, the synthesizer including in combination:

first phase locked loop means for providing the synthesizer output signal, said first phase locked loop means having an input frequency Fi and a first feedback circuit comprising a first variable divider means for dividing the frequency of signals applied thereto by a divisor N1 so that Fo is proportional to N1×Fi;

second phase locked loop means for providing a control signal having a selectable frequency, said second phase locked loop means having a second feedback circuit;

second variable divider means included in said second feedback circuit, said second divider means dividing the frequency of signals applied thereto by a second divisor N2;

reference oscillator means for providing a first reference signal;

third variable divider means for dividing the frequency of signals applied thereto by said first divisor N1, said third divider means being coupled to said second phase locked loop means;

first circuit means coupling said reference oscillator means to said third divider means; and second circuit means coupling said second phase locked loop means to said first phase locked loop means, said second circuit means being responsive to said control signal to provide to said first phase locked loop said input frequency Fi having different values corresponding to different values of N1 and N2, said synthesizer output signal having said selected one of any of said plurality of predetermined discrete carrier frequencies.

21. The signal sending system of claim 20 wherein said second circuit means includes:

means for providing an offset reference signal;

mixer means having first and second inputs and an output;

third circuit means coupling said first input of said mixer means to said second phase locked loop means;

fourth circuit means coupling said second input of said mixer means to said means for providing said offset reference signal; and fifth circuit means coupling said output of said mixer means to said first phase locked loop means to provide said input frequency Fi to said first phase locked loop means.

22. The signal sending system of claim 21 wherein said means for providing said first offset reference signal includes further oscillator means.

23. The signal sending system of claim 22 wherein said means for providing said first offset reference signal further includes modulator means.

24. The signal sending system of claim 21 wherein said third circuit means includes fixed divider means.

25. The signal sending system of claim 20 wherein said first circuit means includes in combination:

third phase locked loop means having an input and an output, said input of said third phase locked loop means being coupled to said reference oscillator means; and offset circuit means coupled between said output of said third phase locked loop means and said third variable divider means.

26. A frequency synthesizer of output frequency Fo, comprising:

means for receiving a first signal of a first frequency;

means for receiving a second signal of a second frequency and generating therefrom another frequency proportional to the second frequency divided by a first number;

first circuit means for receiving the another frequency and providing a third frequency proportional to a product of the another frequency by a second number;

second circuit means for combining the first and third frequencies to provide a fourth frequency proportional to a sum of the first and third frequencies; and third circuit means for receiving the fourth frequency and providing output frequency Fo which is proportional to a product of the fourth frequency times the first number.

27. The frequency synthesizer of claim 26 wherein the third circuit means comprises a phase lock loop means having therein a divider means of divisor equal the first number.

28. The frequency synthesizer of claim 26 wherein the first circuit means comprises (a) phase lock loop means having therein a divider means of a first integer divisor and (b) a further divider of a second integer divisor, arranged so that the second number equals a ratio of the first and second integer divisors.

29. The frequency synthesizer of claim 26 wherein the first number is an integer.

30. A source of oscillating signals of predetermined output frequency Fo, comprising:

means for generating first and second reference signals of first and second frequencies, respectively;

means for dividing the second reference frequency by a first number, thereby providing a further frequency proportional to the ratio of the first frequency divided by the first number;

first circuit means for receiving the further frequency and providing a still further third frequency proportional to a product of the further frequency by a second number;

means for providing a yet further fourth frequency by dividing the still further third frequency by a third number;

means for mixing the first frequency and the yet further fourth frequency to produce an additional fifth frequency proportional to a sum or difference of the first and fourth frequencies; and means for receiving the additional fifth frequency and producing predetermined output frequency Fo proportional to a product of the additional fifth frequency and the first number.

31. The source of claim 30 further comprising means for modulating the first or second frequencies.

32. Apparatus for producing signals of a predetermined output frequency Fo adjustable in coarse and fine steps, comprising:

means for generating first and second reference frequencies;

fine frequency adjustment means comprising (a) first divider means for dividing the second reference frequency by a first numerical factor, thereby providing a first intermediate frequency and (b) means for receiving the first intermediate frequency and providing a second intermediate frequency proportional to the first intermediate frequency multiplied by a numerical fine frequency adjustment factor;

means for combining the first reference frequency and the second intermediate frequency to produce a third intermediate frequency proportional to a sum or difference frequency of the first reference frequency and the second intermediate frequency; and coarse frequency adjustment means comprising means for receiving the third intermediate frequency and producing predetermined output frequency Fo proportional to a product of the third intermediate frequency and the first numerical factor wherein the first numerical factor is a numerical coarse frequency adjustment factor.

33. The apparatus of claim 32 wherein the numerical fine frequency adjustment factor equals a ratio of integers.

34. The apparatus of claim 32 wherein the numerical fine frequency adjustment factor equals a ratio of first and second integers and the means for providing the second intermediate frequency comprises: (i) means for providing another intermediate frequency equal to the first integer times the first intermediate frequency and (ii) means for dividing the another intermediate frequency by a second integer to produce the second intermediate frequency.

35. A method for providing a signal of predetermined output frequency Fo adjustable in predetermined coarse and fine steps, comprising:

providing first and second reference frequencies;

providing a first intermediate frequency proportional to the second reference frequency divided by a first number;

providing a second intermediate frequency proportional to the first intermediate frequency multiplied by a numerical fine frequency adjustment factor;

combining the first reference frequency and the second intermediate frequency to produce a third intermediate frequency proportional to a sum or difference frequency of the first reference frequency and the second intermediate frequency; and producing predetermined output frequency Fo proportional to a product of the third intermediate frequency and a numerical coarse frequency adjustment factor equal the first number.

36. The method of claim 35 wherein the step of providing a second intermediate frequency comprises providing a second intermediate frequency proportional to a product of the first intermediate frequency and a ratio of a first integer and a second integer.

37. The method of claim 36 wherein the step of providing a second intermediate frequency, comprises (i) providing another intermediate frequency equal to the first intermediate frequency multiplied by a first integer and (ii) dividing the another intermediate frequency by a second integer.

* * * * *